(12) United States Patent
Sakakima et al.

(10) Patent No.: US 6,258,470 B1
(45) Date of Patent: Jul. 10, 2001

(54) EXCHANGE COUPLING FILM, MAGNETORESISTANCE EFFECT DEVICE, MAGNETORESISTANCE EFFECTIVE HEAD AND METHOD FOR PRODUCING EXCHANGE COUPLING FILM

(75) Inventors: Hiroshi Sakakima, Kyotanabe; Eiichi Hirota, Hirakata; Yasuhiro Kawawake, Uji; Mitsuo Satomi, Katano; Yasunari Sugita, Kadoma, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/228,703

(22) Filed: Jan. 12, 1999

(30) Foreign Application Priority Data

Jan. 16, 1998 (JP) .................................................. 10-006682
Jun. 12, 1998 (JP) .................................................. 10-164886
Sep. 8, 1998 (JP) .................................................. 10-253538

(51) Int. Cl.$^7$ ............................................................ G11B 5/66
(52) U.S. Cl. ............ 428/692; 428/694 R; 428/694 TM; 428/900; 427/129; 360/113; 324/252; 338/32 R
(58) Field of Search ........................... 428/692, 694 TM, 428/900; 427/129; 360/113; 324/252; 338/32 R

(56) References Cited

U.S. PATENT DOCUMENTS

| | | |
|---|---|---|
| 5,563,331 | 10/1996 | Von Helmolt et al. . |
| 5,932,343 * | 8/1999 | Hayashi .............................. 428/332 |
| 6,001,430 * | 12/1999 | Fujikata ............................. 427/548 |
| 6,074,767 * | 6/2000 | Liu ..................................... 428/692 |

FOREIGN PATENT DOCUMENTS 59-087616   5/1984 (JP) .

OTHER PUBLICATIONS

European Search Report dated Mar. 23, 1999 related to application No. 99100579.4.
Communication Pursuant to Article 96(2) EPC, Dec. 12, 2000, Application No. 99 100 579.4–2111.
N. N. Greenwood, A. Earnshaw "Chemistry of the Elements," p. 1105 and p. 1430, Pergamon Press pic., 1984.

* cited by examiner

Primary Examiner—Leszek Kiliman
(74) Attorney, Agent, or Firm—Renner, Otto, Boisselle & Sklar, LLP

(57) ABSTRACT

An exchange coupling film of the present invention includes a ferromagnetic layer and a pinning layer which is provided in contact with the ferromagnetic layer for pinning a magnetization direction of the ferromagnetic layer, the pinning layer including an $(AB)_2O_x$ layer, wherein: O denotes an oxygen atom; $2.8<x<3.2$; and a value t as defined by:

$t = (Ra+Ro)/(\sqrt{2} \cdot (Rb+Ro))$ (where Ra, Rb and Ro denote the ion radii of the atoms A, B and O, respectively)

satisfies $0.8 < t < 0.97$.

40 Claims, 10 Drawing Sheets

EXCHANGE COUPLING FILM, MAGNETORESISTANCE EFFECT DEVICE, MAGNETORESISTANCE EFFECTIVE HEAD AND METHOD FOR PRODUCING EXCHANGE COUPLING FILM

BACKGROUND OF THE INVENTION

1. Field of the Invention

The present invention relates to an exchange coupling film for fixing a magnetization direction of a ferromagnetic body, a magnetoresistance effect device incorporating the same which causes a substantial magnetoresistance change with a low magnetic field, a magnetoresistance head incorporating the same which is suitable for use in high density magnetic recording and reproduction, and a method for producing such an exchange coupling film.

2. Description of the Related Art

In recent years, the density of hard disk drives has been dramatically increased, while reproduction magnetic heads have also been improved dramatically. Among others, a magnetoresistance effect device (hereinafter, referred to simply as an "MR device") utilizing a giant magnetoresistance effect, which is also called a "spin valve", has been researched actively and is expected to have the potential to significantly improve the sensitivity of a currently-employed magnetoresistance effect head (hereinafter, referred to simply as an "MR head").

A spin valve includes two ferromagnetic layers and a non-magnetic layer interposed between the ferromagnetic layers. The magnetization direction of one of the ferromagnetic layers (hereinafter, referred to also as a "pinned layer") is fixed by an exchange bias magnetic field from a pinning layer (the ferromagnetic layer and the pinning layer are referred to collectively as an "exchange coupling film"). The magnetization direction of the other one of the ferromagnetic layers (hereinafter, referred to also as a "free layer") is allowed to change relatively freely in response to an external magnetic field. In this way, the angle between the magnetization direction of the pinned layer and that of the free layer is allowed to change so as to vary the electric resistance of the MR device.

A spin valve film has been proposed which utilizes Ni-Fe for the ferromagnetic layer, Cu for the non-magnetic layer and Fe-Mn for the pinning layer. The spin valve film provides a magnetoresistance rate of change (hereinafter, referred to simply as an "MR ratio") of about 2% (Journal of Magnetism and Magnetic Materials 93, p. 101, (1991)). When Fe-Mn is used for the pinning layer, the resulting MR ratio is small, and the blocking temperature (a temperature at which the pinning layer provides no effect of fixing the magnetization direction of the pinned layer) is not sufficiently high. Moreover, the Fe-Mn film itself has a poor corrosion resistance. In view of this, other spin valve films have been proposed which employ pinning layers with materials other than Fe-Mn.

Among others, a spin valve film which employs an oxide, such as NiO or $\alpha$-$Fe_2O_3$, for the pinning layer is expected to realize a dramatically large MR ratio of about 15% or greater.

However, the blocking temperature of NiO is not sufficiently high. Therefore, the thermal stability of the MR device employing NiO is undesirable.

When a spin valve film employs a pinning layer of $\alpha$-$Fe_2O_3$, on the other hand, the reverse magnetic field of the pinned layer is not sufficiently large when the pinning layer is thin. Particularly, a spin valve film having a dual spin valve structure or a spin valve film where an $\alpha$-$Fe_2O_3$ layer is formed on the pinned layer has a strong tendency that the reverse magnetic field of the pinned layer obtained in the overlying $\alpha$-$Fe_2O_3$ layer is insufficient. Moreover, the thermal stability of the $\alpha$-$Fe_2O_3$-employing spin valve film is also undesirable for the same reasons as the NiO-employing spin valve film. Furthermore, the $\alpha$-$Fe_2O_3$-employing spin valve film has other problems in controlling the anisotropy during deposition in a magnetic field or during a low-temperature heat treatment in a magnetic field.

SUMMARY OF THE INVENTION

According to one aspect of this invention, an exchange coupling film includes a ferromagnetic layer and a pinning layer which is provided in contact with the ferromagnetic layer for pinning a magnetization direction of the ferromagnetic layer, the pinning layer including an $(AB)_2O_x$ layer, wherein: O denotes an oxygen atom; $2.8<x<3.2$; and a value t as defined by:

$t=(Ra+Ro)/(\sqrt{2} \cdot (Rb+Ro))$ (where Ra, Rb and Ro denote the ion radii of the atoms A, B and O, respectively) satisfies $0.8<t<0.97$.

In one embodiment of the invention, the $(AB)_2O_x$ includes an antiferromagnetic layer.

In another embodiment of the invention, the atom B of the $(AB)_2O_x$ layer includes a transition metal atom.

In still another embodiment of the invention, the atom B of the $(AB)_2O_x$ layer includes an Fe atom.

In still another embodiment of the invention, the atom A of the $(AB)_2O_x$ layer includes a rare earth atom.

In still another embodiment of the invention, the atom A of the $(AB)_2O_x$ layer includes an alkaline-earth atom.

In still another embodiment of the invention, the pinning layer includes a layered structure of the $(AB)_2O_x$ layer and an NiO layer.

In still another embodiment of the invention, the $(AB)_2O_x$ layer is provided in contact with the ferromagnetic layer.

In still another embodiment of the invention, the pinning layer includes a layered structure of the $(AB)_2O_x$ layer and an Fe-M-O layer (where M=Al, Ti, Co, Mn, Cr, Ni or V).

In still another embodiment of the invention, the Fe-M-O layer includes an $(Fe_{1-x}M_x)_2O_3$ layer (where M=Al, Ti, Co, Mn, Cr, Ni or V, and $0.01 \leq x \leq 0.4$).

According to another aspect of this invention, a magnetoresistance effect device includes a substrate and a multilayer film. The multilayer film includes at least two ferromagnetic layers, a non-magnetic layer and a pinning layer for pinning a magnetization direction of the ferromagnetic layer. The ferromagnetic layers are deposited via the non-magnetic layer interposed therebetween. At least one of the ferromagnetic layers is a pinned layer whose magnetization direction is fixed by the pinning layer which is provided in contact with the one of the ferromagnetic layers on an opposite side of another one of the ferromagnetic layers with respect to the non-magnetic layer. At least one of the ferromagnetic layers is a free layer whose magnetization direction is allowed to rotate freely. A change in an angle between the magnetization direction of the pinned layer and the magnetization direction of the free layer causes an electric resistance of the device to vary. The pinning layer includes an $(AB)_2O_x$ layer, wherein: O denotes an oxygen atom; $2.8<x<3.2$; and a value t as defined by:

$t=(Ra+Ro)/(\sqrt{2} \cdot (Rb+Ro))$ (where Ra, Rb and Ro denote the ion radii of the atoms A, B and O, respectively)
satisfies $0.8<t<0.97$.

In still another embodiment of the invention, the pinning layer includes a layered structure of the $(AB)_2O_x$ layer and an NiO layer.

In still another embodiment of the invention, the pinning layer includes a layered structure of the $(AB)_2O_x$ layer and an Fe-M-O layer (where M=Al, Ti, Co, Mn, Cr, Ni or V).

In still another embodiment of the invention, the atom B of the $(AB)_2O_x$ layer includes a transition metal atom.

In still another embodiment of the invention, the atom A of the $(AB)_2O_x$ layer includes a rare earth atom.

In still another embodiment of the invention, the atom A of the $(AB)_2O_x$ layer includes an alkaline-earth atom.

In still another embodiment of the invention, AB of the $(AB)_2O_x$ layer includes $La_{1-y}Fe_y$ ($0.4<y<0.6$).

In still another embodiment of the invention, the atom A of the $(AB)_2O_x$ layer includes an A' atom or an A" atom, and the atom B of the $(AB)_2O_x$ layer includes an B' atom or an B" atom. The A' atom includes a rare earth atom; the A" atom includes an alkaline-earth atom; the B' atom includes an Fe atom; and the B" atom includes an Ni or Mn atom.

In still another embodiment of the invention, the A' atom includes an La atom; the A" atom includes an Sr atom; the B' atom includes an Fe atom; and the B" atom includes an Ni atom.

In still another embodiment of the invention, the free layer includes two or more magnetic films deposited via the non-magnetic layer interposed therebetween.

In still another embodiment of the invention, the pinned layer includes two magnetic layers having an anti-ferromagnetic exchange coupling therebetween via the non-magnetic layer interposed therebetween.

In still another embodiment of the invention, the multi-layer includes a first pinning layer, a first pinned layer, a first non-magnetic layer, a ferromagnetic free layer, a second non-magnetic layer, a second pinned layer and a second pinning layer which are deposited in this order on the substrate. The first pinning layer fixes a magnetization direction of the first pinned layer. The second pinning layer fixes a magnetization direction of the second pinned layer. The first pinning layer includes the $(AB)_2O_x$ layer.

In still another embodiment of the invention, the second pinning layer includes a T-Mn (where T=Ir, Pt, Pd, Rh, or Ni).

In still another embodiment of the invention, the second pinning layer includes the $(AB)_2O_x$ layer.

In still another embodiment of the invention, the first pinning layer or the first and second pinning layers include a layered structure of the $(AB)_2O_x$ layer and an NiO layer.

In still another embodiment of the invention, the first pinning layer or the first and second pinning layers include a layered structure of the $(AB)_2O_x$ layer and an Fe-M-O layer (where M=Al, Ti, Co, Mn, Cr, Ni or V).

In still another embodiment of the invention, the Fe-M-O layer includes an $(Fe_{1-x}M_x)_2O_3$ layer (where M=Al, Ti, Co, Mn, Cr, Ni or V, and $0.01 \leq x \leq 0.4$).

In still another embodiment of the invention, the atom B of the $(AB)_2O_x$ layer includes an Fe atom.

In still another embodiment of the invention, the atom A of the $(AB)_2O_x$ layer includes a rare earth atom.

In still another embodiment of the invention, the atom A of the $(AB)_2O_x$ layer includes an alkaline-earth atom.

In still another embodiment of the invention, AB of the $(AB)_2O_x$ layer includes $La_{1-y}Fe_y$ ($0.4<y<0.6$).

In still another embodiment of the invention, the atom A of the $(AB)_2O_x$ layer includes an Al atom or an A" atom, and the atom B of the $(AB)_2O_x$ layer includes an B' atom or an B" atom. The A' atom includes a rare earth atom; the A" atom includes an alkaline-earth atom; the B' atom includes an Fe atom; and the B" atom includes an Ni or Mn atom.

In still another embodiment of the invention, the A' atom includes an La atom; the A" atom includes an Sr atom; the B' atom includes an Fe atom; and the B" atom includes an Ni atom.

In still another embodiment of the invention, the free layer includes two or more magnetic films deposited via the non-magnetic layer interposed therebetween.

In still another embodiment of the invention, the pinned layer includes two magnetic layers having an anti-ferromagnetic exchange coupling therebetween via the non-magnetic layer interposed therebetween.

According to still another aspect of this invention, a magnetoresistance effect head includes: a magnetoresistance effect device of the present invention; and a shield gap section for insulating the magnetoresistance effect device and the shield section from each other.

According to still another aspect of this invention, a magnetoresistance effect head includes: a magnetoresistance effect device of the present invention; and a yoke section for introducing into the magnetoresistance effect device a magnetic field to be detected.

According to still another aspect of this invention, a method for producing an exchange coupling film includes the steps of: heating a substrate to a temperature of about 300° C. or higher; and depositing the exchange coupling film by a sputtering method using an Ar gas at a pressure of about 2 mTorr or less.

In order to solve the problems in the prior art, the exchange coupling film of the present invention is formed by depositing a ferromagnetic layer and an $(AB)_2O_x$ layer for fixing the magnetization direction of the ferromagnetic layer. Herein, O denotes an oxygen atom; $2.8<x<3.2$; and a value t as defined by:

$$t=(Ra+Ro)/(\sqrt{2}\cdot(Rb+Ro))$$

(where Ra, Rb and Ro denote the ion radii of the atoms A, B and O, respectively) satisfies $0.8<t<0.97$.

The expression $(AB)_2O_x$ indicates that the composition ratio of the total of the A and B elements with respect to the O element is 2:X (i.e., $(A_{1-y}B_y)_2O_x$). While both of the A element and the B element should be included, the ratio between the A element and the B element may be arbitrary (preferably, such that $0.4<y<0.6$). Particularly, when the A element and the B element are included at a ratio of 1:1, the resultant composition will be $A_1B_1O_x$, which will hereinafter represented as "$ABO_x$". A representative example of $ABO_3$, among others, is one which has a crystalline structure called a "perovskite structure".

When the exchange coupling film is deposited on a substrate, which has been heated to a temperature of about 300° C. or higher, by sputtering using an Ar gas at a pressure of about 2 mTorr or less, the exchange coupling film exhibits a greater exchange coupling and preferable characteristics for use as an MR device. During the deposition step, it is preferable to apply a magnetic field in the film plane so as to fix the axis of easy magnetization.

While the above-described $(AB)_2O_x$ layer is basically used as a film to be coupled with the ferromagnetic layer, desirable structures thereof include the following:

(1) An $(AB)_2O_x$ layer in which B is Fe;

(2) An $(AB)_2O_x$ layer in which A is a rare earth atom, (3) An $(AB)_2O_x$ layer in which A is an alkaline-earth atom;

(4) A layered structure of an $(AB)_2O_x$ layer and an NiO layer;

(5) A layered structure of an $(AB)_2O_x$ layer and an Fe-M-O layer (where M=Al, Ti, Co, Mn, Cr, Ni or V); and (6) A structure of (5), in which the Fe-M-O layer is an $(Fe_{1-x}M_x)$-O layer (where M=Al, Ti, Co, Mn, Cr, Ni or V, and $0.01 \leq x \leq 0.4$).

In the MR device of the present invention, the magnetization direction of at least one of the ferromagnetic layers, which are deposited together via a non-magnetic layer interposed therebetween, is fixed by the pinning layer which is provided in contact with the one of the ferromagnetic layers on an opposite side of another one of the ferromagnetic layers with respect to the non-magnetic layer (this ferromagnetic layer is called a pinned layer). On the other hand, the magnetization direction of at least one of the ferromagnetic layers is allowed to rotate freely (this ferromagnetic layer is called a free layer). A change in the angle between the magnetization direction of the pinned layer and that of the free layer causes an electric resistance of the device to vary. The pinning layer for fixing the magnetization direction of the pinned layer may be formed of the above-described $(AB)_2O_x$ material. While the above-described $(AB)_2O_x$ layer is basically used for the pinning layer, desirable structures include the above-described structures (1)–(6).

A particularly preferable example of the $(AB)_2O_x$ layer may be an $La_{1-y}Fe_yO_x$ layer (where $0.4<y<0.6$, and $2.8<x<3.2$) in which A is La and B is Fe.

Moreover, the $(AB)_2O_x$ layer may be such that A is A'A", and B is B'B", wherein A' is a rare earth element such as Y or La, A" is an alkaline-earth element such as Ca, Sr or Ba, B' is Fe, and B" is Ni or Mn, for example. In the case of a composition $(A'A")_{1-y}(B'B")_yO_x$, y is preferably such that $0.4<y<0.6$.

A particularly preferable example may be one in which A' is La, A" is Sr, B' is Fe, and B" is Ni.

An exemplary structure of the MR device of the present invention includes an $(AB)_2O_x$ layer as a first pinning layer, a first pinned layer of a ferromagnetic material, a first non-magnetic layer, a free layer of a ferromagnetic material, a second non-magnetic layer, a second pinned layer of a ferromagnetic material and a second pinning layer which are deposited in this order on a substrate. While the above-described $(AB)_2O_x$ layer is basically used for the first pinning layer, desirable structures include the above-described structures (1)–(6). For the second pinning layer, the $(AB)_2O_x$ layer or any of above-described structures (1)–(6) may be used. Alternatively, a T-Mn metal antiferromagnetic film (where T=Ir, Pt, Pd, Rh, or Ni) may be used.

Furthermore, the present invention includes the following two types of MR heads: an MR head which is obtained by providing a shield section to the MR device of the present invention; and an MR head which is provided with a yoke of a softmagnetic material for introducing into the MR device a magnetic field to be detected.

Thus, the invention described herein makes possible the advantages of: (1) providing an exchange coupling film having a good thermal stability and a large MR ratio; (2) providing an MR device incorporating such an exchange coupling film; (3) providing an MR head incorporating such an MR device; and (4) providing a method for producing such an MR device.

These and other advantages of the present invention will become apparent to those skilled in the art upon reading and understanding the following detailed description with reference to the accompanying figures.

DESCRIPTION OF THE PREFERRED EMBODIMENTS

An MR device and an MR head of the present invention will now be described with reference to the accompanying figures.

Figure 1:
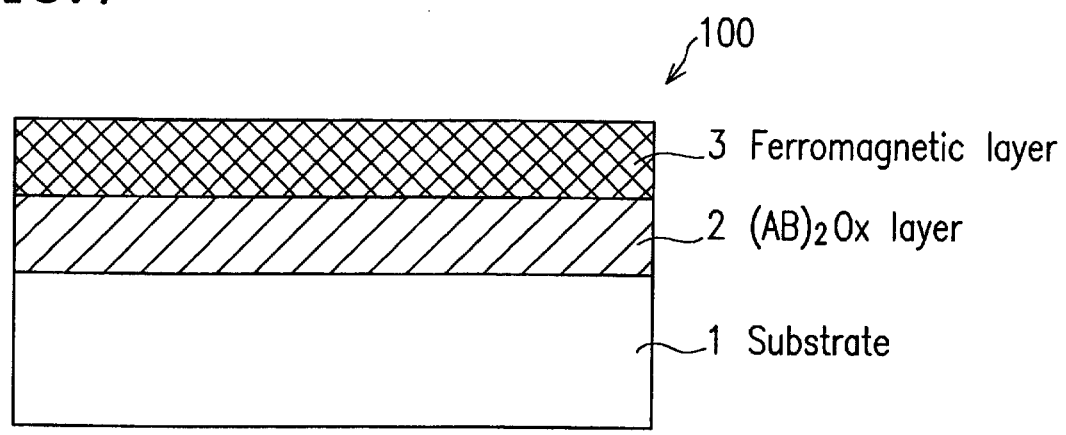
FIG. 1 is a cross-sectional diagram illustrating an exchange coupling film of the present invention.

FIG. 1 illustrates a structure of an exchange coupling film of the present invention. Referring to FIG. 1, an $(AB)_2O_x$ layer 2 and a ferromagnetic film 3 are deposited in this order on a substrate 1. A feature of the present invention is the use of an $(AB)_2O_x$ layer as a pinning layer for applying an exchange bias magnetic field to the ferromagnetic layer. Desirable structures of the present invention include the above-described structures (1)–(6).

Next, an MR device using such an exchange coupling film will be described in greater detail.

Figure 2A:
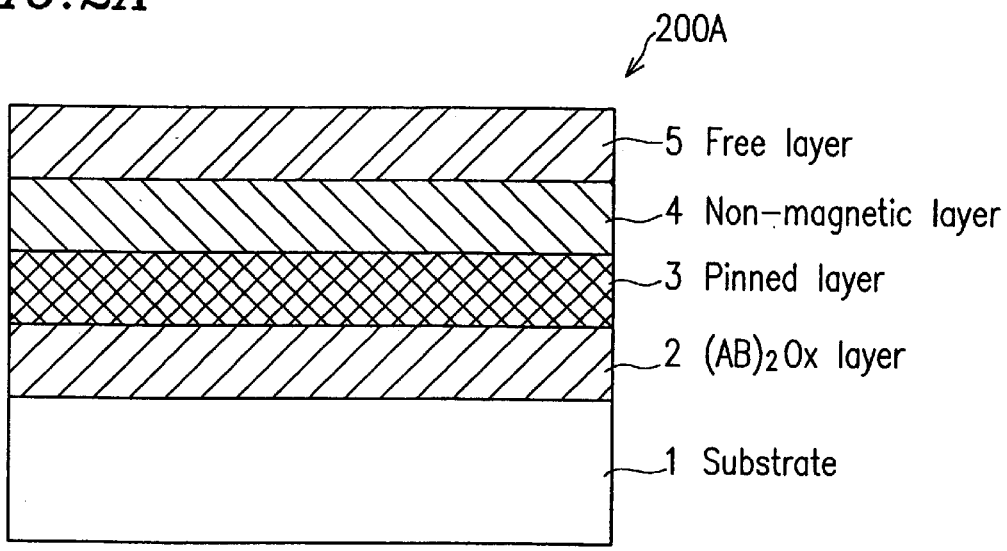
FIG. 2A is a cross-sectional diagram illustrating an MR device of the present invention.

FIG. 2A is a cross-sectional view illustrating a structure of an MR device of the present invention. Referring to FIG. 2A, an $(AB)_2O_x$ layer 2, a pinned layer 3, a non-magnetic layer 4 and a free layer 5 are deposited in this order on a substrate 1. The magnetization direction of the pinned layer 3, which is a ferromagnetic layer, is fixed by an exchange bias magnetic field from the $(AB)_2O_x$ layer 2. The free layer 5, which is another ferromagnetic layer, is magnetically separated from the pinned layer via the non-magnetic layer 4, so that the magnetization direction thereof is allowed to change relatively freely in response to an external magnetic field. In this way, the angle between the magnetization direction of the pinned layer and that of the free layer is allowed to change so as to vary the electric resistance of the MR device. When the MR device is used as an MR sensor, the change in the electric resistance of the MR device in response to an external magnetic field can be detected as an electrical signal.

A feature of the present invention is the use of an $(AB)_2O_x$ oxide layer, which has a high resistance as a pinning layer and is capable of controlling the magnetization direction of a magnetic layer at high temperatures.

As is described above in the prior art section, a spin valve film using NiO or $\alpha$-$Fe_2O_3$ exhibits a large magnetoresistance ratio (MR ratio). However, in the NiO or $\alpha$-$Fe_2O_3$ spin valve, the magnetic field provided for fixing the pinned layer is insufficient. The tendency is greater in the $\alpha$-$Fe_2O_3$ layer when $\alpha$-$Fe_2O_3$ is used for pinning an upper pinned layer in a dual structure. NiO has a disadvantage that it may lose its capability of pinning a magnetic layer at a temperature of about 200° or higher.

In order to solve this problem, the present invention employs an $(AB)_2O_x$ oxide film as a pinning layer. In $(AB)_2O_x$: O denotes an oxygen atom; $2.8 < x < 3.2$; and a value t as defined by:

$$t = (Ra+Ro)/(\sqrt{2} \cdot (Rb+Ro))$$

(where Ra, Rb and Ro denote the ion radii of the atoms A, B and O, respectively)

satisfies $0.8 < t < 0.97$.

When these conditions are not met, there is not provided a sufficient effect of fixing the magnetization direction of the magnetic layer. In $(AB)_2O_x$, "A" denotes an element which has a large ion radius, e.g., a rare earth element such as La, Pr, Nd, Sm or Y, or an alkaline-earth element such as Ca or Sr. Other desirable elements include Bi. Moreover, the A element may comprise two elements A' and A", wherein A' is one of the rare earth elements and A" is one of the alkaline-earth elements, for example. Preferably, "B" in $(AB)_2O_x$ is a transition metal which has a small ion radius. Fe is particularly preferable for a pinning layer which provides the pinning effect at high temperatures. When the A element comprises two elements, such as A' and A", the B element may similarly comprise two elements B' (e.g., Fe) and B" (e.g., Ni, Mn). A particularly preferable combination of the elements is A'=La, A"=Sr, B'=Fe and B"=Ni, for example.

Generally, when some of the Fe atoms are substituted with Ni atoms, or the like, although the MR ratio would remain at substantially the same level, the level of the pinning magnetic field, Hp, tends to decrease. However, this can be solved by substituting some of the rare earth (e.g., La) atoms with alkaline-earth (e.g., Sr) atoms, whereby the device exhibits satisfactory characteristics as an MR device.

Moreover, a pinning layer may be provided as a multilayer film of the $(AB)_2O_x$ oxide film and the NiO or Fe-M-O film. When NiO is used, preferably, the magnetization direction of the magnetic layer is fixed by the $(AB)_2O_x$ film, while using NiO as an underlying layer for the $(AB)_2O_x$ film. By using NiO as an underlying layer, it is possible to provide a substantial pinning effect even when the thickness of the $(AB)_2O_x$ film is as small as about 30 nm or less. However, when NiO is used for pinning the magnetic layer, the resultant thermal stability and the obtained pinning effect would not be as good as those obtained by the $(AB)_2O_x$ film.

In the Fe-M-O film, the M element comprises one or two element selected from the group consisting of Al, Ti, Co, Mn, Cr, Ni and V. In order to provide a satisfactory effect of pinning the pinned layer, the atomic composition ratio between the metal (Fe+M) and the oxygen (O) should be around $\frac{2}{3}$.

An atomic composition ratio between O and Fe+M outside the range of about 1.2 to about 1.6 is not preferred. The atomic composition ratio between O and Fe+M less than about 1.2 results in a poor pinning effect. When the atomic composition ratio between O and Fe+M is greater than about 1.6, the Fe-M-O layer becomes a weak ferromagnetic body unsuitable for use in an MR head.

When Co, Ni, or the like, is used as the M element in the Fe-M-O film, the spin valve film would provide a greater pinning magnetic field during production of the MR device or after a heat treatment.

Among others, Mn and Co are particularly effective in obtaining a large MR ratio. For a greater pinning magnetic field, Co is particularly effective. It is effective to use Al, Ti, Cr or V as the M element so as to perform an anisotropic control by a low-temperature heat treatment at a temperature of about 250° C. or less.

A desirable composition of the Fe-M-O layer is:

$(Fe_{1-x}M_x)$—O (where M=Al, Ti, Co, Mn, Cr, Ni or V, and $0.01 \leq x \leq 0.4$).

When x is excessively small, the resulting effect is insufficient. When x is excessively large, the resulting pinning effect may be reduced.

Figure 4:
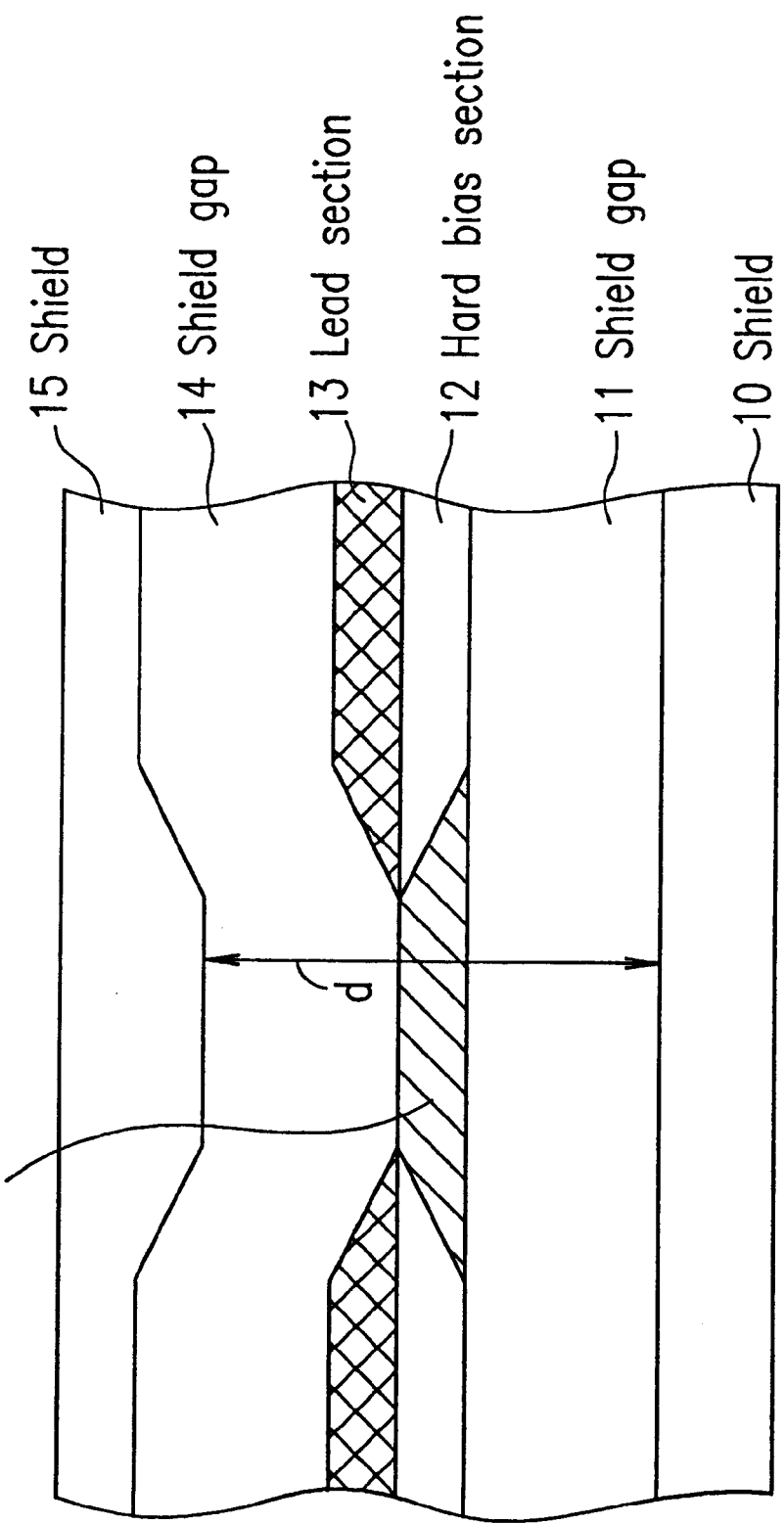
FIG. 4 is a cross-sectional diagram illustrating an MR head of the present invention.

Since the thickness of a shield gap for a high density recording magnetic head is about 200 nm to about 100 nm, when the $(AB)_2O_x$ film or a layered film of the $(AB)_2O_x$ film and the NiO or Fe-M-O film is used in a shield type magnetic head, as illustrated in FIG. 4, the thickness d of the $(AB)_2O_x$ film or the layered film should be about 50 nm or less and, more preferably about 30 nm or less.

Usually, an Ni-Co-Fe alloy layer is suitably used as the free layer 5 of the spin valve film. Preferably, the atomic composition ratio of the $Ni_xCo_yFe_z$ layer may be:

$0.6 \leq x \leq 0.9$ $0 \leq y \leq 0.4$ $0 \leq z \leq 0.3$ (thereby obtaining an Ni-rich soft magnetic film); or $0 \leq x \leq 0.4$ $0.2 \leq y \leq 0.95$ $0 \leq z \leq 0.5$ (thereby obtaining a Co-rich film).

A film having such a composition exhibits a low magnetostriction ($1 \times 10^{-5}$) which is required for an MR sensor or an MR head.

Figure 3A:
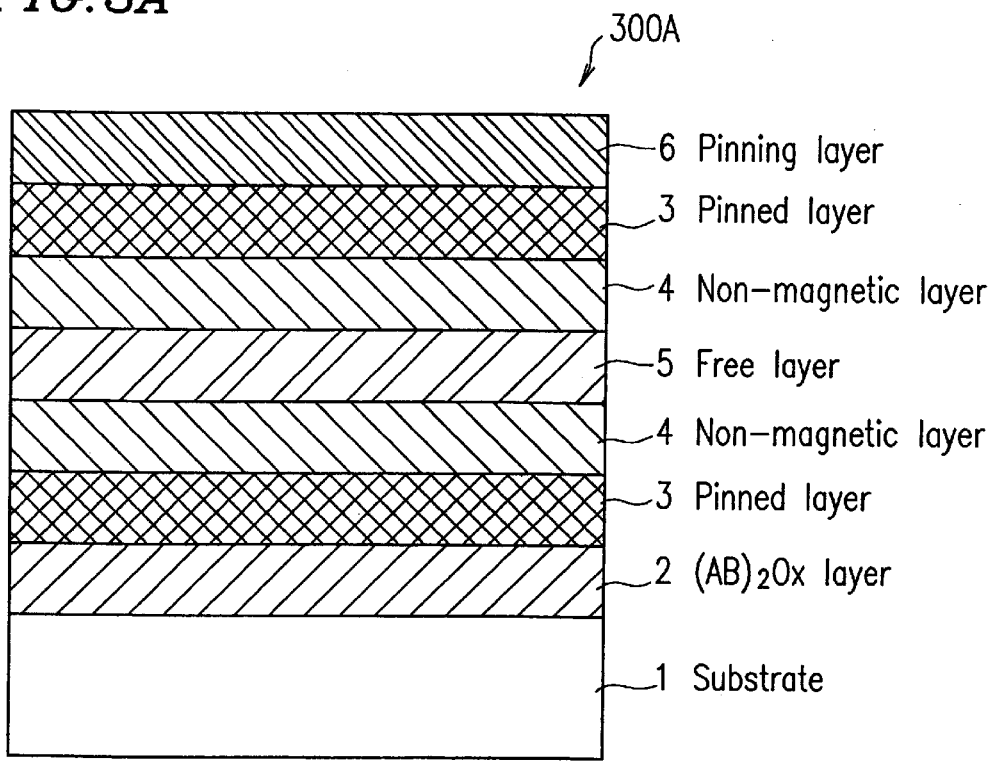
FIG. 3A is a cross-sectional diagram illustrating another MR device of the present invention.

An amorphous layer, such as a Co-Mn-B layer, a Co-Fe-B layer, a Co-Nb-Zr layer, or a Co-Nb-B layer, or a layered film of such an amorphous layer and the Ni-Co-Fe layer, may alternatively be used as the free layer 5. In such a case, however, the resistance of the device will be relatively high. Therefore, it is not very suitable for a dual structure, as illustrated in FIG. 3A, but should preferably be used for a structure of the type as illustrated in FIG. 2A.

Preferably, the thickness of the free layer 5 is in a range between about 1 nm and about 10 nm. When the free layer 5 is excessively thick, the MR ratio is reduced due to a shunting effect. When the free layer 5 is excessively thin, the soft magnetic property is reduced. More preferably, the thickness of the free layer 5 is in a range between about 2 nm and about 7 nm.

Preferred materials for the pinned layer 3 include Co, a Co-Fe alloy, an Ni-Fe alloy, or an Ni-Fe-Co alloy.

Figure 2B:
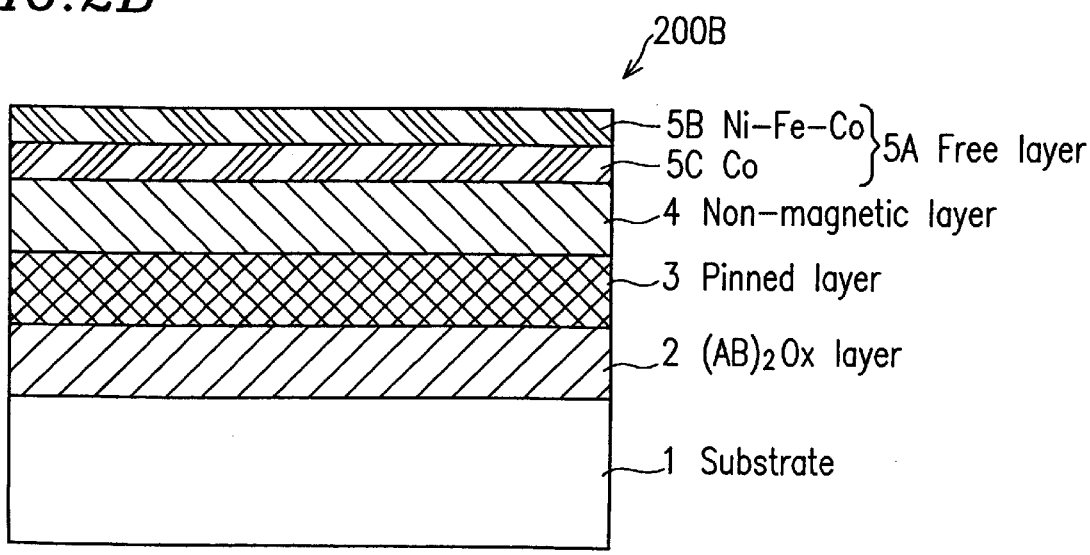
FIG. 2B is a cross-sectional diagram illustrating a variation of the MR device of FIG. 2A.
Figure 3B:
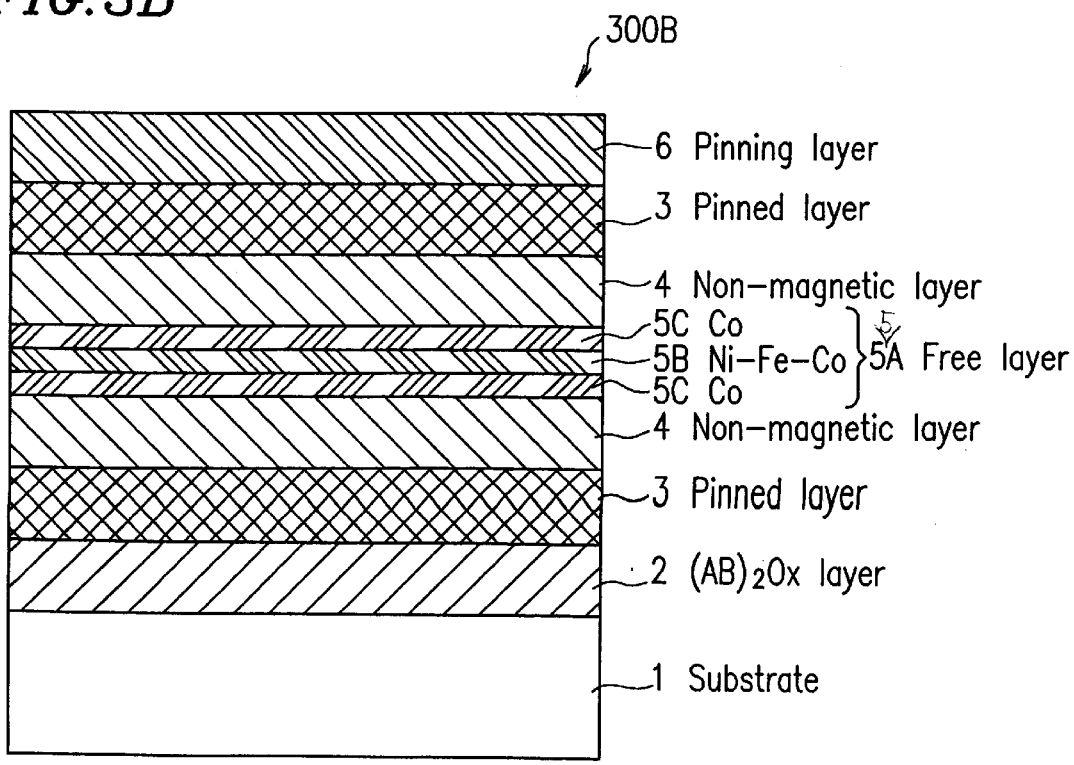
FIG. 3B is a cross-sectional diagram illustrating a variation of the MR device of FIG. 3A.

A particularly large MR ratio can be obtained when Co or a Co-Fe alloy is used. In particular, it is desirable to employ a Co layer 5C at the interface between a free layer 5A and the non-magnetic layer 4, and an Ni-Fe-Co layer 5B on the Co layer 5C, as illustrated in FIG. 2B. It is also desirable to employ a Co layer 5C at the interface between the free layer 5A and the non-magnetic layer 4, and the Ni-Fe-Co layer 5B substantially in the middle of a free layer 55A, as illustrated in FIG. 3B.

The pinned layer 3 may be in a multilayer structure including two magnetic layers which have an anti-ferromagnetic exchange coupling therebetween via the non-magnetic layer 4. More particularly, the pinned layer 3 may be a Co/Ru/Co multilayer film, for example. In such a case, the thickness of Ru needs to be such that there is provided an antiferromagnetic exchange coupling between the two Co films (e. g., about 0.6 nm in this instance). In the case of a normal MR device, when the MR device is extremely small, a problem arises where a magnetic pole occurring at the end surface of the pinned layer 3 applies an undesirable bias magnetic field to the free layer 5. When the pinned layer 3 is formed of two magnetic layers which have an antiferromagnetic exchange coupling, substantially no bias magnetic field is applied to the free layer 5, thereby solving this problem.

Preferably, the thickness of the pinned layer 3 is in a range between about 1 nm and about 10 nm. The MR ratio is reduced when the pinned layer 3 is either excessively thin or excessively thick. More preferably, the thickness of the pinned layer 3 is in a range between about 1 nm and about 5 nm.

While the non-magnetic layer 4 between the free layer 5 and the pinned layer 3 may be made of Cu, Ag, Au, Ru, or the like, Cu is particularly preferred. The thickness of the non-magnetic layer 4 needs to be at least about 0.9 nm in order to reduce the interaction between the two ferromagnetic layers (the pinned layer 3 and the free layer 5). When the non-magnetic layer 4 is excessively thick, the MR ratio is reduced. Therefore, the thickness of the non-magnetic layer 4 should be 10 nm or less, and more preferably about 3 nm or less.

It is also effective to insert an interface magnetic layer at the interface between one of the ferromagnetic layers (the pinned layer 3 or the free layer 5) and the non-magnetic layer 4 in order to further increase the MR ratio of the MR device. When the interface magnetic layer is excessively thick, the sensitivity of the MR ratio to the magnetic field is reduced. Therefore, the thickness of the interface magnetic layer is preferably about 2 nm or less, and more preferably about 1.8 nm or less. In order for the interface magnetic film to effectively function, the thickness thereof should be at least about 0.2 nm, and more preferably about 0.8 nm or greater. Preferably, Co or a Co-rich Co-Fe alloy is used as the material of the interface magnetic film.

Preferably, the substrate 1 has a relatively smooth surface, and may be a glass substrate, an MgO substrate, a Si substrate or an $Al_2O_3$-TiC substrate. An $Al_2O_3$-TiC substrate is particularly suitable for producing an MR head.

Another way to further increase the MR ratio of the MR device is to form a metal reflective layer on the free layer 5 in the structure illustrated in FIG. 2A. Preferably, Ag, Au, or the like, is used as the material of the metal reflective layer.

When the metal reflective layer is excessively thick, the MR ratio is reduced due to a shunting effect. Therefore, the thickness of the metal reflective layer is preferably about 10 nm or less, and more preferably about 3 nm or less. When the metal reflective layer is excessively thin, the resulting effect will not be sufficient. Therefore, the thickness of the metal reflective layer should be at least about 0.5 nm or greater, and more preferably about 1 nm or greater.

In the example described above in connection with FIG. 2A, the $(AB)_2O_x$ layer 2, the pinned layer 3, the non-magnetic layer 4 and the free layer 5 are deposited in this order on the substrate 1. These layers may alternatively be deposited in the opposite order (the free layer 5/ the non-magnetic layer 4/ the pinned layer-3/ the $(AB)_2O_x$ layer 2) on the substrate 1 directly or via an underlying layer. This reverse structure results in a slightly reduced pinning effect from that obtained by the structure illustrated in FIG. 2A, but can still be used as an MR device and may be effective for some particular device designs.

While a normal spin valve film has been described above, an MR device 300 having a dual spin valve structure, as illustrated in FIG. 3A, is also effective, particularly for further increasing the MR ratio. In such a case, an $(AB)_2O_x$ layer, an IrMn layer, an NiMn layer, an Fe-M-O layer, or a compound layer (layered film) of an Fe-M-O layer and an $(AB)_2O_x$ layer, can be used for an uppermost pinning layer 6. An $(AB)_2P_x$ layer or an Fe-M-O layer is particularly preferred in order to further increase the MR ratio. In view of an MR device electrode formation or MR head formation, it is appropriate to use a metal antiferromagnetic material such as Ni-Mn, Pd-Mn, Pt-Mn, Ir-Mn, Fe-Ir, Pd-Pt-Mn, Cr-Pt-Mn, Ru-Rh-Mn, or the like. Among others, Ni-Mn is believed to be the most preferred material in view of the heat resistance. In view of the MR ratio, Ir-Mn is believed to be the most preferred material. Preferably, the atomic composition ratio of an $Ir_zMn_{1-z}$ layer may be:

$0.1 \leq z \leq 0.5$.

In the example illustrated in FIGS. 3A and 3B, the $(AB)_2O_x$ layer 2 is deposited first on the substrate 1. Alternatively, the layers may be deposited on the substrate 1 in the reverse order from the pinning layer 6 to the pinning layer 2.

While, in the above instance, an $(AB)_2O_x$ film is used solely as the pinning layer 2, as illustrated in FIGS. 1, 3A and 3B, an NiO film and an $(AB)_2O_x$ film, for example, may alternatively be layered to form the pinning layer 2. When using the NiO/$(AB)_2O_x$ film, it is preferable in view of the thermal stability and the film flatness to form an NiO film first on the substrate 1, and then an $(AB)_2O_x$ film on the NiO layer, so that the layer 3 is pinned by the $(AB)_2O_x$ film. In such a case, the thickness of the NiO film can be about 10 nm, while the Fe-M-O film is preferably thicker than the NiO film.

The layers can be formed suitably by a sputtering method. Sputtering methods which can be used to produce the MR device of the present invention include a DC sputtering method, an RF sputtering method, an ion beam sputtering method, and the like.

Figure 5:
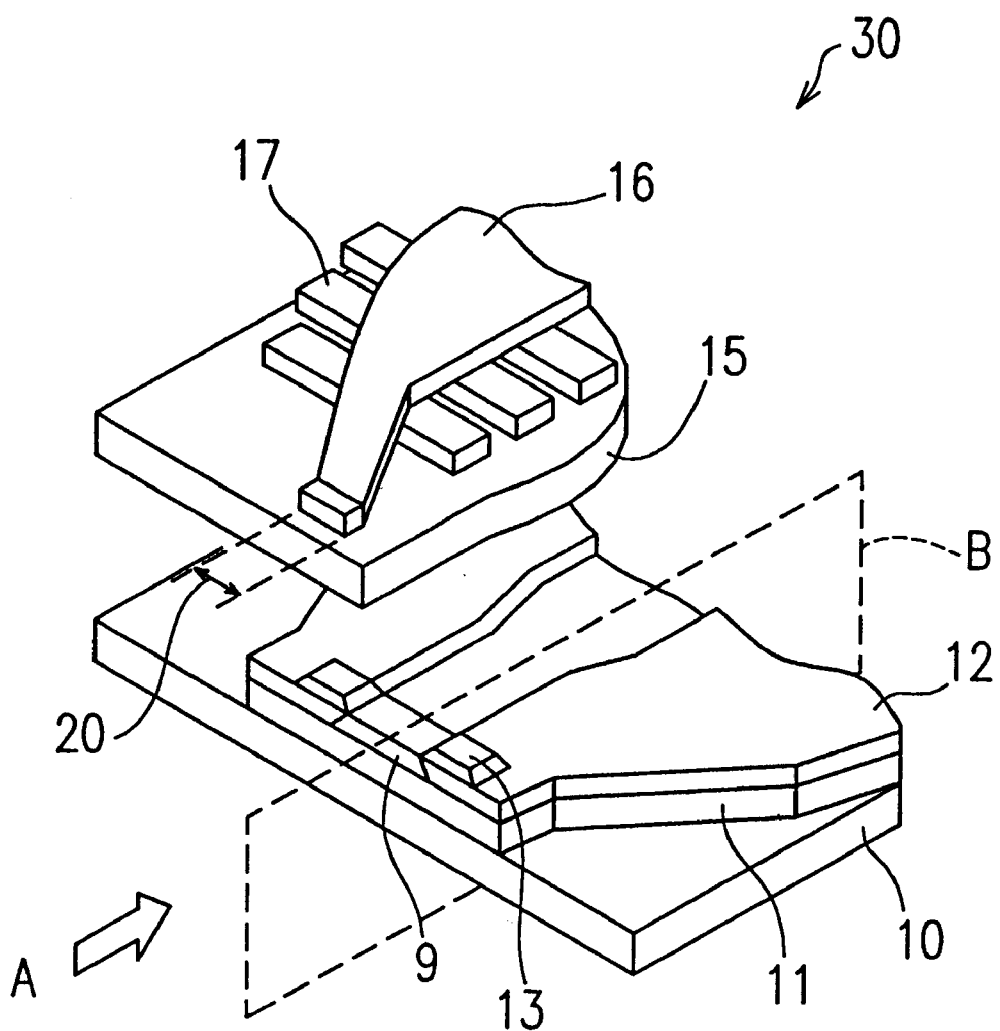
FIG. 5 is a perspective view illustrating the MR head of the present invention.
Figure 6:
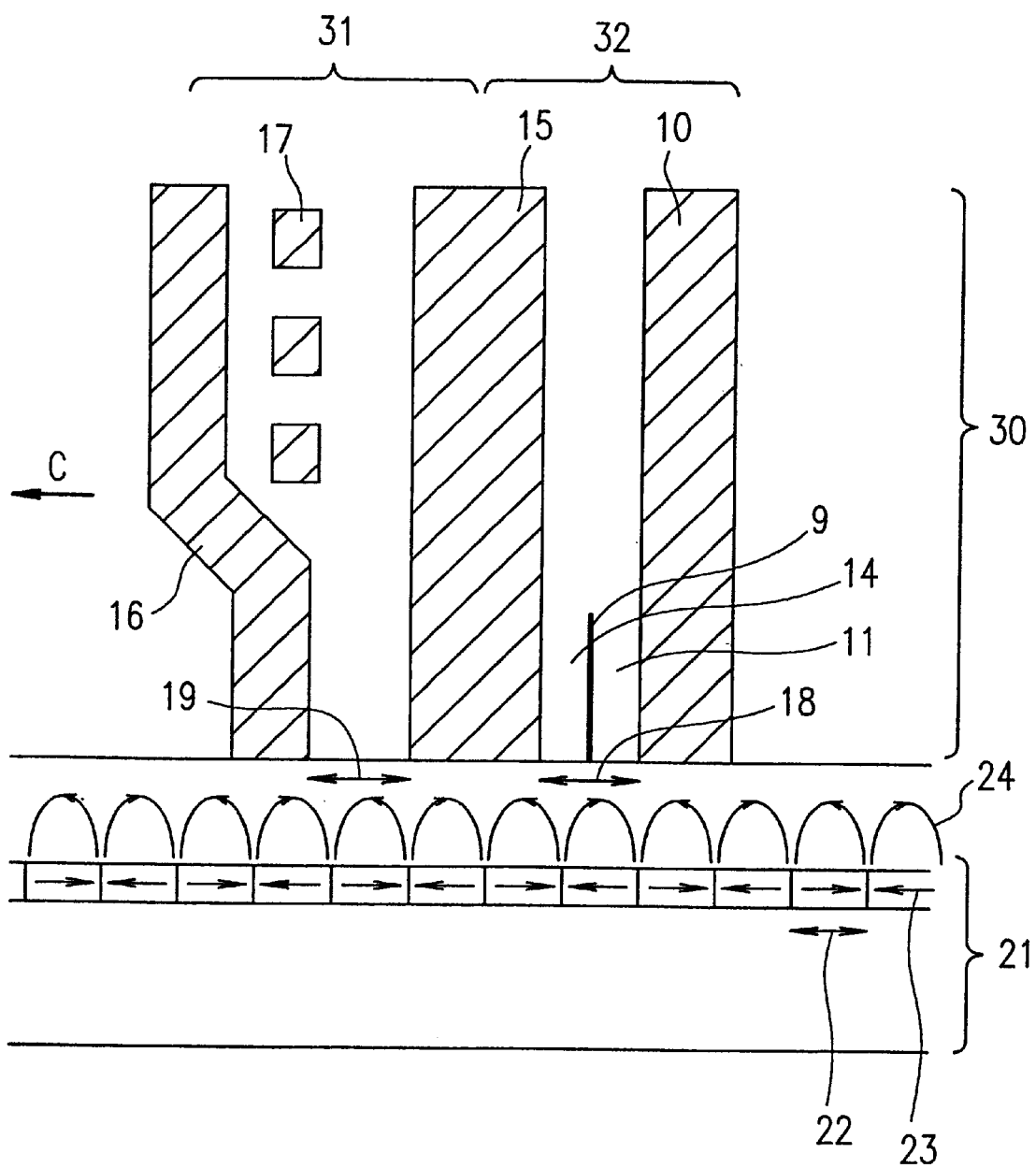
FIG. 6 is a cross-sectional view illustrating the MR head of the present invention along with a magnetic disk.

An MR head can be produced using the above-described MR device of the present invention. FIG. 5 is a perspective view which illustrates a structure of an exemplary hard film bias type MR head 30 of the present invention. FIG. 4 illustrates a cross-sectional view of FIG. 5 as viewed from the direction indicated by an arrow A in FIG. 5. FIG. 6 illustrates a cross-sectional view of FIG. 5 taken along a plane indicated by a broken line B in FIG. 5. FIG. 4 will be mainly referred to in the following description.

Referring to FIG. 4, an MR device section 9 is interposed between upper and lower shield gaps 14 and 11. An insulation film such as an $Al_2O_3$ film, an $SiO_2$ film, an AlN film, or the like, may be used as the shield gaps 11 and 14. Upper and lower shields 15 and 10 are further provided on the shield gaps 14 and 11, respectively. A soft magnetic film such as an Ni-Fe alloy film may be used as the shield material. In order to control the magnetic domain of the MR device, a bias magnetic field is applied by a hard bias section 12 made of a material such as a Co-Pt alloy. While a hard film is used in this instance for applying a bias magnetic field, an anti-ferromagnetic film such as an Fe-Mn film can similarly be used. The MR device section 9 is insulated from the shields 10 and 15 by the shield gaps 11 and 14, and changes in the resistance of the MR device section 9 can be read by applying an electric current thereto through a lead section 13.

Figure 7A:
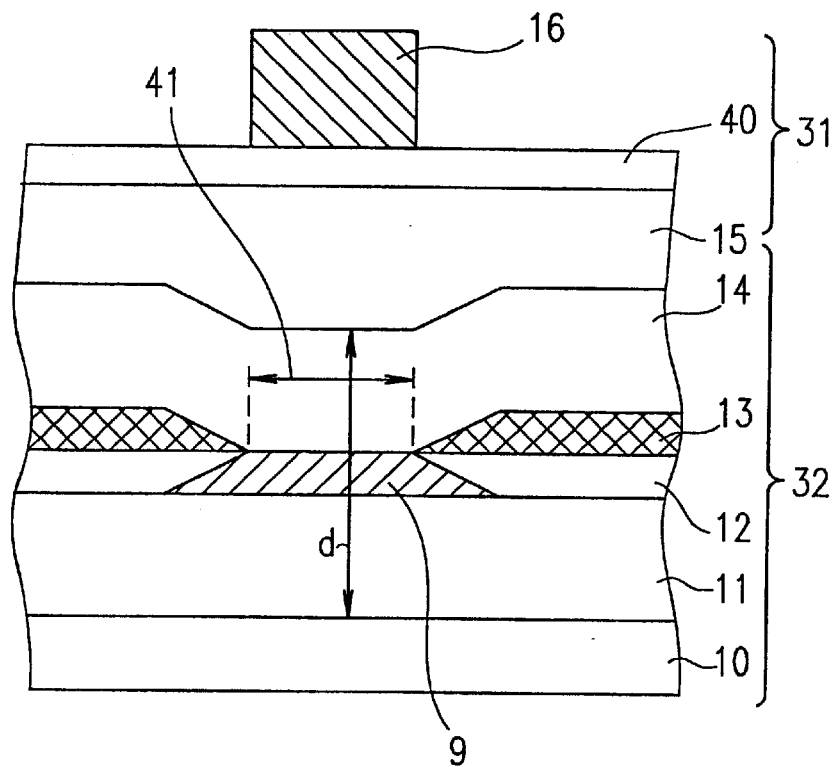
FIG. 7A is a cross-sectional view illustrating an MR head integrated with a recording head according to the present invention.
Figure 7B:
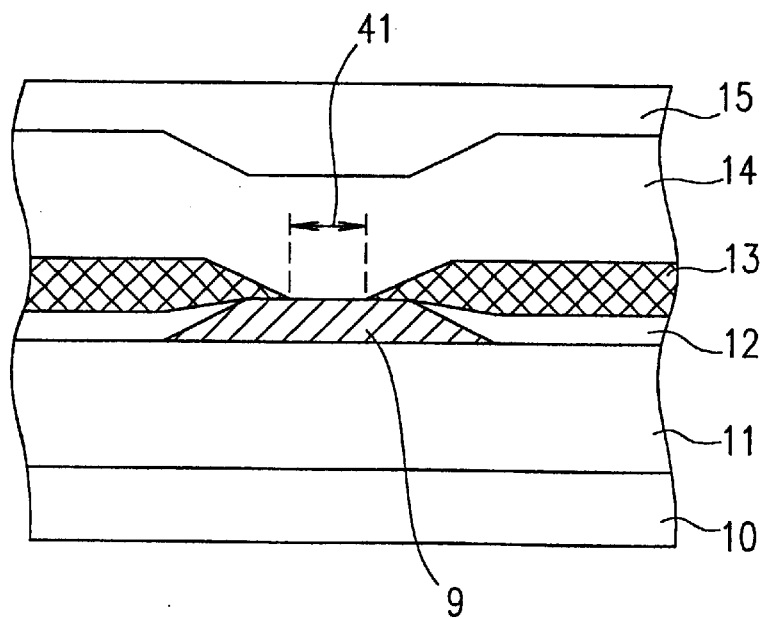
FIG. 7B is a cross-sectional view illustrating another MR head of the present invention.

Since an MR head is a read only head, it is typically used in combination with an induction head for writing. FIGS. 6, 7A and 7B illustrate a write head section 31 as well as a read head section 32. FIG. 7A illustrates the same structure as illustrated in FIG. 4 with the write head section 31 being additionally provided thereon. The write head section 31 includes an upper core 16 which is provided above the upper shield 15 via a recording gap film 40.

While FIG. 7A illustrates an MR head having a conventional abutted junction, FIG. 7B illustrates another effective MR head with an overlaid structure in which a track width 41 can be more precisely controlled. Therefore, the structure illustrated in FIG. 7B may be able to better account for a track width reduction resulting from an increase in the recording density.

Now, the recording and reproduction mechanism of the MR head 30 will be described with reference to FIG. 6. Referring to FIG. 6, during a recording operation, a magnetic flux which is generated by an electric current conducted through a coil 17 and leaks through a space between the upper core 16 and the upper shield 15, thereby writing information on a magnetic disk 21. The MR head 30 moves in a direction indicated by an arrow c in the figure with respect to the magnetic disk 21, where it is possible to reverse a recording magnetization direction 23 by reversing the direction of the current flow though the coil 17. When the recording density is increased, the recording length (recording pitch) 22 becomes shorter, whereby it is necessary to reduce a recording gap length (recording gap pitch) 19 accordingly.

In a reproduction operation, a magnetic flux 24 leaking from a recording magnetization section of the magnetic disk 21 acts upon the MR device section 9 between the shields 10 and 15, thereby altering the resistance of the MR device section 9. Since a current is conducted to the MR device section 9 through the lead section 13, a change in the resistance thereof can be read as a change in the voltage (output) thereof.

Figure 8:
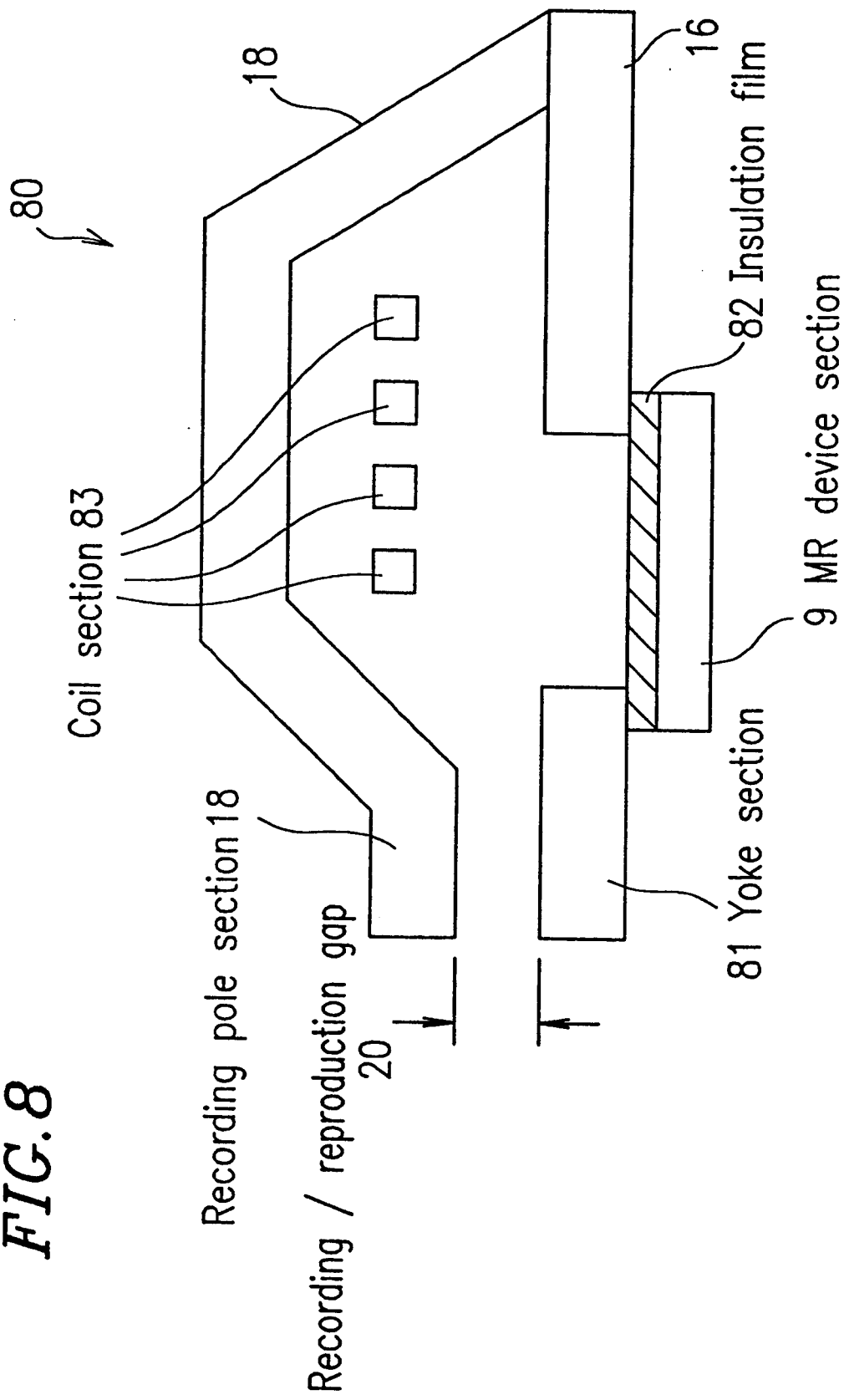
FIG. 8 is a cross-sectional view illustrating a yoke-type MR head of the present invention.

FIG. 8 illustrates a structure of a yoke-type head 80 incorporating the MR device of the present invention.

Referring to FIG. 8, the yoke-type head 80 includes a yoke section 81 made of a soft magnetic film for guiding to the MR device section 9 a signal magnetic field to be detected. Since a conductive metal magnetic film is normally used for the yoke section 81, an insulation film 82 may preferably be provided in order to avoid short-circuiting between the yoke section 81 and the MR device section 9. The illustrated insulation film 82 may be optional when the MR device section 9 is in a dual structure, as illustrated in FIG. 3A, where the upper pinning layer employs an oxide insulation film such as the $(AB)_2O_x$ film or the Fe-M-O film, for example. While each of the insulation films 14 and 11 in the structure illustrated in FIG. 4 should be a non-magnetic film or a weak magnetic film which does not adversely influence the head characteristics, the insulation film 82 of FIG. 8 does not have to be non-magnetic. In particular, the insulation film 82 may be magnetic in order for a signal magnetic field guided by the yoke section 81 to continuously enter the MR device section 9. Therefore, when the upper pinning layer of the MR device section 9 employs an $(AB)_2O_x$ film or an Fe-M-O film, the insulation film 82 may be optional. Thus, it is suitable for the illustrated yoke-type head 80 to employ a dual structure where an $(AB)_2O_x$ film or an Fe-M-O film is formed in the upper portion.

Moreover, since the above-described yoke-type head employs a yoke section, the output thereof may be lower than that of a head of the type illustrated in FIG. 4. However, since the MR device does not have to be interposed between shield gaps, as in the structure illustrated in FIG. 4, the yoke-type head may be advantageous in realizing a super narrow gap.

Figure 9:
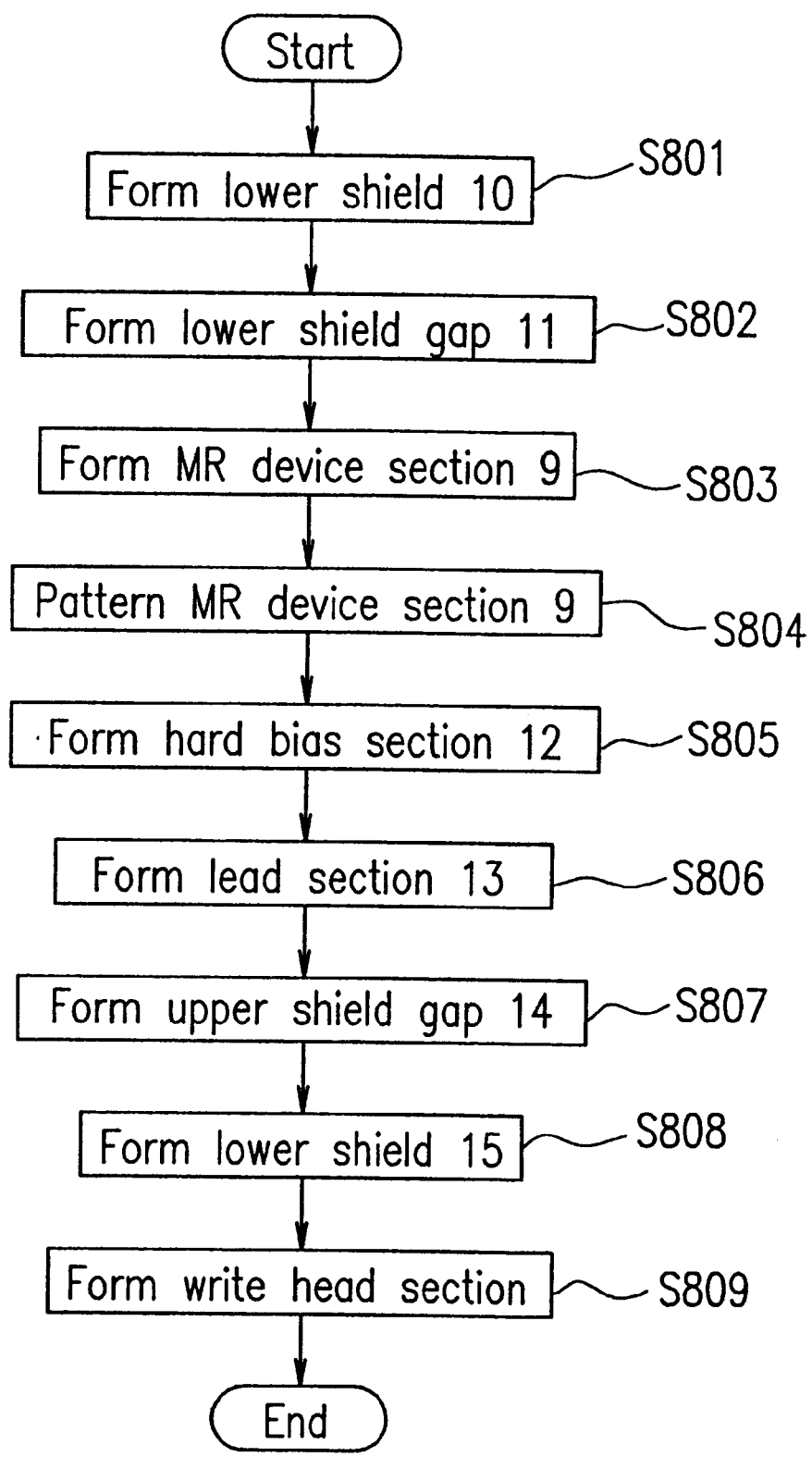
FIG. 9 is a flow chart illustrating steps of producing an MR head of the present invention.

Referring to FIG. 9, a method for producing the MR head 30 will now be described.

First, the lower shield 10, as illustrated in FIG. 4, is formed on an appropriately processed substrate (S801). Then, the lower shield gap 11 is formed on the lower shield 10 (S802), and an MR device section layer is formed on the lower shield gap 11 (S803). After the MR device section layer is patterned into the MR device section 9 (S804), the hard bias section 12 (S805) and the lead section 13 (S806) are formed. Then, the upper shield gap 14 (S807) and the upper shield 15 (S808) are formed. Finally, the write head section 31 is formed, as illustrated in FIG. 7A (S809), thereby obtaining the MR head 30.

Figure 10:
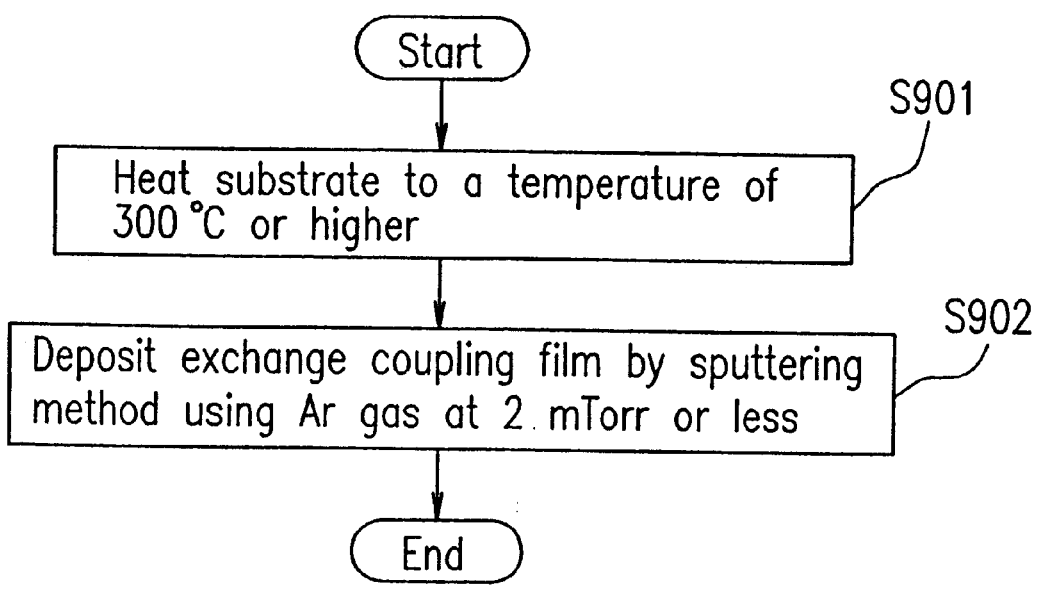
FIG. 10 is a flow chart illustrating steps of producing an exchange coupling film of the present invention.

Referring to FIG. 10, a method for producing an exchange coupling film will now be described. The substrate 1, as illustrated in FIG. 1, is heated to a temperature of about 300° C. or higher (S901). Then, the exchange coupling film 100, as illustrated in FIG. 1, is deposited by a sputtering method using an Ar gas at about 2 mTorr or less (S902).

In view of a future increase in recording density of hard disk drives, the recording wavelength (recording pitch) should be shortened, for which it may be necessary to shorten the distance d between the shields as illustrated in FIG. 4. As can be seen from FIG. 4, it may be necessary to reduce the thickness of the MR device section 9. Preferably, the thickness of the MR device section 9 should be about 20 nm or less. Since the pinning layer 2 of an oxide film such as an $(AB)_2O_x$ film used in the present invention is an insulator, the pinning layer 2 can be considered substantially to be a part of the lower shield gap 11, rather than the MR device section 9. Such a structure is suitable for the purposes of the present invention. A conventional $\alpha$-$Fe_2O_3$ film had to have a thickness of about 50 nm or more, and it was thus difficult to use it in a dual structure.

In order to suppress generation of Barkhausen noise when the magnetization direction of the free layer rotates, the MR device section 9 preferably has an arrangement such that an axis of easy magnetization (also referred to as an "easy axis") of the free layer 5 (FIGS. 2A and 3A) is substantially perpendicular to the direction of a magnetic field of a signal to be detected, whereas the easy axis of the pinned layer 3 are parallel to the direction.

In the above description, a conventional lateral GMR head has been described. However, the present invention can effectively be used in a vertical GMR head. While the direction of the current flow in the lateral GMR head is perpendicular to the magnetic field to be detected, the direction of the current flow in the vertical GMR head is parallel to the magnetic field to be detected.

EXAMPLES

The exchange coupling film, the MR device and the MR head of the present invention will now be described by way of illustrative examples.

Example 1

An exchange coupling film according to Example 1 of the present invention was produced by using a multi-sputtering apparatus. $ABO_3$ (A=La, Pr, Nd, Sm, Gd, Tb, Dy, Y, Ho, Bi, Ca, Sr; B=Fe) sintered to a target and an alloy plate of $Co_{0.9}Fe_{0.1}$ were used.

After a vacuum chamber was exhausted to about $1 \times 10^{-8}$ Torr, an Ar gas was supplied therein so as to maintain the pressure therein at about 0.8 mTorr while the exchange coupling film 100, as illustrated in FIG. 1, was formed on the glass substrate using a sputtering method, thereby producing a sample exchange coupling film having the structure as illustrated in FIG. 1. The composition of the sample film is shown below, wherein the respective thicknesses (in nm) of the layers thereof are shown in parentheses. An RF cathode was used when $ABO_3$ was employed, and a DC cathode was used when any other material was employed. The $ABO_3$ layer had a thickness of about 50 nm, and the Co-Fe layer had a thickness of about 10 nm.

Samples 1 to 13 as specified below were produced, where B=Fe in each of Samples 1 to 13.

Sample 1: CoFe(10) Sample 2: $LaBO_3$(50) / CoFe(10) Sample 3: $PrBO_3$(50) / CoFe(10) Sample 4: $NdBO_3$(50) / CoFe(10)

Sample 5: $SmBO_3$(50) / CoFe(10)

Sample 6: $GdBO_3$(50) / CoFe(10)

Sample 7: $TbBO_3$(50) / CoFe(10)

Sample 8: $DyBO_3$(50) / CoFe(10)

Sample 9: $YBO_3$(50) / CoFe(10)

Sample 10: $HOBO_3$(50) / CoFe(10)

Sample 11: $BiBO_3$(50) / CoFe(10)

Sample 12: $CaBO_3$(50) / CoFe(10)

Sample 13: $SrBO_3$(50) / CoFe(10)

The produced exchange coupling film was maintained in a vacuum at about 200° C. for about 1 hour while applying thereto a magnetic field of about 80 kA/m (about 1 kOe). Then, the magnetization curve of the exchange coupling film was measured at room temperature by using a vibrating sample magnetometer.

As a result, the CoFe film of Sample 1 showed a coercive force Hc of about 600 A/m, whereas all of the $ABO_3$/CoFe layered films of Samples 2 to 13 showed a coercive force Hc of about 20 kA/m or larger, thus indicating that there is provided an exchange coupling between $ABO_3$ and CoFe to form a film of a large coercive force.

Example 2

Sample MR devices, A(i) (see Table 1 below), as illustrated in FIG. 2A, were produced by using a multi-sputtering apparatus as in Example 1. An Si substrate was used as the substrate 1, an $(AB)_2O_x$ layer of the type used in Example 1 was used as the pinning layer 2, and a Co layer was used as the ferromagnetic pinned layer 3. Moreover, a Cu layer was used as the non-magnetic layer 4, and an $Ni_{0.68}Fe_{0.20}Co_{0.12}$ layer was used as the free layer 5. The respective thicknesses of the layers hereof were as shown below.

A(i): $ABO_3$(35) / Co(2) / Cu(2) / $Ni_{0.68}Fe_{0.20}Co_{0.12}$(5)

(wherein: i=0 to 12; and a number in parentheses denotes a thickness in nanometer)

As in Example 1, the sample MR device produced as described above was subjected to a heat treatment at about 200° C. for about 30 minutes.

The sample device A(O) employs $\alpha$-$Fe_2O_3$ instead of $ABO_3$ as a comparative example to be compared to the samples A(1) to A(12) of the present invention.

In Table 1, A'(1) denotes a sample which has the same composition and film thicknesses as those of the sample A(1), but in which the $ABO_3$ film is deposited at a substrate temperature of about 500° C.

MR characteristics of the produced sample MR devices were evaluated while applying a magnetic field of up to about 80 kA/m (or greater for the sample A'(1)) by a DC 4-terminal method at room temperature. The results are shown in Table 1 below. For comparison, MR characteristics of the sample MR device A(O) were also evaluated in substantially the same manner. As described above, the sample device A(O) was produced by using an $\alpha$-$Fe_2O_3$ layer in place of the $(AB)_2O_x$ layer.

TABLE 1

| Sample No. | Pinning layer | MR ratio | Hp(kA/m) |
|---|---|---|---|
| A(0) | $\alpha$-$Fe_2O_3$ | 13 | 10 |
| A(1) | $LaBO_3$ | 15 | 45 |
| A'(1) | $LaBO_3$ | 18 | >80 |
| A(2) | $PrBO_3$ | 14 | 40 |
| A(3) | $NdBO_3$ | 14 | 45 |
| A(4) | $SmBO_3$ | 15 | 50 |
| A(5) | $GdBO_3$ | 14 | 35 |
| A(6) | $TbBO_3$ | 14 | 35 |
| A(7) | $DyBO_3$ | 14 | 35 |
| A(8) | $Y BO_3$ | 15 | 50 |
| A(9) | $HoBO_3$ | 14 | 40 |
| A(10) | $BiBO_3$ | 14 | 40 |
| A(11) | $CaBO_3$ | 14 | 40 |
| A(12) | $SrBO_3$ | 14 | 40 |

As can be seen from the experimental results, a sample employing an $ABO_3$ film has a greater value of Hp than that of a sample employing an $\alpha$-$Fe_2O_3$ film.

Moreover, a similar experiment was conducted while producing a sample AA'(1) using an $A'_{1-x}A''_xB'_{1-x}B''_xO_3$ film, wherein A'=La, A''=Sr, B'=Fe, B''=Ni and x=0.1, in place of an $ABO_3$ film. The composition of the produced film was as follows:

AA'(1): $A'_{1-x}A''_xB'_{1-x}B''_xO_3$(50) / Co(2) / Cu(2) / $Ni_{0.68}Fe_{0.20}Co_{0.12}$(5)

(wherein a number in parentheses denotes a thickness in nanometer)

As in Example 1, the sample MR device produced as described above was subjected to a heat treatment at about 200° C. for about 30 minutes. MR characteristics of the produced sample MR devices were evaluated while applying a magnetic field of up to about 80 kA/m (or greater for the sample AA'(1)) by a DC 4-terminal method at room temperature. As a result, the MR ratio was about 16%, and Hp was about 40 kA/m, indicating again that the sample devices have satisfactory characteristics.

Sample devices B(i) were produced, while using Co(2) / Ru(0.6) / Co(2) with an antiferromagnetic exchange coupling for the pinned layer in place of Co(2).

B(i): $ABO_3$(35) / Co(2) / Ru(0.6) / Co(2) / Cu(2) / $Ni_{0.68}Fe_{0.20}Co_{0.12}$(5)

Regarding the $ABO_3$(35) layer, the sample devices B(i) (i=1 to 12) employ the same pinning layers as those of the A(i) (i=1 to 12), respectively. The characteristics of the sample devices B(i) were evaluated in substantially the same manner as for the sample devices A(i). The sample devices B(i) had MR ratios which are reduced by about 2%, on average, from those of the respective sample devices A(i), but the sample devices B(i) had Hp values which all were about 100 kA/m or greater. It was also observed that there is substantially no bias influence on the free layer due to the magnetic pole occurring at the end surface of the pinned layer.

Sample devices B'(i) were further produced, where the same films as those listed in Table 1 were used for the pinning layers, and the free layer includes a plurality of magnetic layers deposited via the non-magnetic layer.

B'(i): $ABO_3$(35) / Co(2) / Cu(2) / $Ni_{0.68}Fe_{0.20}Co_{0.12}$(2.5) / Cu(1) / $Ni_{0.68}Fe_{0.20}Co_{0.12}$(2. 5)

Characteristics of the produced sample devices B'(i) were evaluated in substantially the same manner as for the sample devices A(i). The $ABO_3(35)$ layer employed the same pinning layers as those of the sample devices A(1) to A(12) listed in Table 1.

As a result, the sample device B'(i) of the present invention had substantially the same MR ratio and substantially the same Hp value with an improved soft magnetic property of the free layer. In particular, the coercive force of the soft magnetic layer was reduced from about 800 A/m to about 400 A/m. Thus, it is possible to improve the soft magnetic property of the free layer and the magnetic field sensitivity of the device by forming the free layer from two or more magnetic films layered via a non-magnetic layer.

Example 3

MR heads as illustrated in FIG. 4 were produced while using the sample devices B(i: i=1 to 12) and the sample device B(O) (comparative example) for the MR device section 9, and the characteristics thereof were evaluated.

In each of the produced MR heads, an $Al_2O_3$-TiC material was employed for the substrate, an $Ni_{0.8}Fe_{0.2}$ alloy for the shields 10 and 15, and $Al_2O_3$ for the shield gaps 11 and 14. Moreover, a Co-Pt alloy was used for the hard bias section 12, and Au for the lead section 13. The magnetic films were provided with an anisotropy in such a way that the easy axis of the pinned layer 3 was substantially parallel to the direction of a magnetic field of a signal to be detected, whereby the easy axis of the free layer 5 was substantially perpendicular to the direction of the magnetic field of the signal to be detected. This was achieved by first subjecting the produced MR device to a heat treatment at about 250° C. in a magnetic field so as to define the direction of the easy axis of the pinned layer 3, and then further subjecting the produced MR device to a heat treatment at about 180° C. so as to define the direction of the easy axis of the free layer 5.

The respective outputs of the produced MR heads were evaluated while conducting a DC current as a sense, current through these MR heads and applying an alternating signal magnetic field of about 3 kA/m thereto. The output of the MR head employing the MR device B(i) of the present invention was compared with that of the MR head employing the comparative MR device B(O). The results are shown in Table 2 below.

TABLE 2

| Sample No. | Pinning layer | Relative output(dB) |
| --- | --- | --- |
| B(0) | $\alpha$-$Fe_2O_3$ | 0 |
| B(1) | $LaBO_3$ | +2 |
| B(2) | $PrBO_3$ | +1 |
| B(3) | $NdBO_3$ | +1 |
| B(4) | $SmBO_3$ | +2 |
| B(5) | $GdBO_3$ | +1 |
| B(6) | $TbBO_3$ | +1 |
| B(7) | $DyBO_3$ | +1 |
| B(8) | $Y BO_3$ | +2 |
| B(9) | $HoBO_3$ | +1 |
| B(10) | $BiBO_3$ | +1 |
| B(11) | $CaBO_3$ | +1 |
| B(12) | $SrBO_3$ | +1 |

Thus, it has been confirmed that the MR head of the present invention can produce a greater output as compared with that from the conventional MR head. When the characteristics were measured after applying an external magnetic field of about 20 kA/m, the output of the MR head employing the comparative MR device B(O) became unstable, while the output of the MR head employing any of the MR devices B(1) to B(12) of the present invention was stable.

Example 4

Spin valve films C(i) of a composite type including a free layer and a pinning layer were produced in substantially the same manner as in Example 2. A composite type layer of an NiO layer and an $ABO_3$ layer was employed for the respective pinning layers, while a composite type layer of CoFe and NiFe was employed for the free layer. The Cu layer provided at the end of each sample film is an antioxidation film.

C(i): NiO(10) / $ABO_3(20)$ / $Co_{0.85}Fe_{0.15}(2)$ / Cu(2.2) / $Co_{0.85}Fe_{0.15}(1)$ / $Ni_{0.8}Fe_{0.2}(5)$ / Cu(1)

As in Example 1, the sample films produced as described above were subjected to a heat treatment at about 200° C. for about 30 minutes. MR characteristics of the produced sample films were evaluated in substantially the same manner as in Example 2. The results are shown in Table 3 below.

TABLE 3

| Sample No. | $ABO_3$ layer | MR ratio | Hp(kA/m) |
| --- | --- | --- | --- |
| C(1) | $LaBO_3$ | 18 | 45 |
| C(2) | $PrBO_3$ | 17 | 40 |
| C(3) | $NdBO_3$ | 17 | 45 |
| C(4) | $SmBO_3$ | 18 | 50 |
| C(5) | $GdBO_3$ | 17 | 35 |
| C(6) | $TbBO_3$ | 16 | 35 |
| C(7) | $DyBO_3$ | 16 | 35 |
| C(8) | $Y BO_3$ | 18 | 50 |
| C(9) | $HoBO_3$ | 16 | 40 |
| C(10) | $BiBO_3$ | 16 | 40 |
| C(11) | $CaBO_3$ | 17 | 40 |
| C(12) | $SrBO_3$ | 17 | 40 |

As can be appreciated from comparison between the results shown in Table 3 with those shown in Table 1, substantially the same level of Hp values can be obtained even when providing the free layer as a composite layer, thereby increasing the MR ratio, while providing the pinning layer as a composite layer, thereby reducing the thickness of the pinning layer.

Example 5

As in Example 1, dual spin valve films D(i), E(i) and F(i), as illustrated in FIG. 3A, were produced.

D(i): $ABO_3(30)$ / Co(3) / Cu(2.5) / Co(1) / $Ni_{0.8}Fe_{0.2}(5)$ / Co(1) / Cu(2.5) / Co(3) / Ir-Mn(8)

E(i): $ABO_3(30)$ / Co(3) / Cu(2.5) / Co(1) / $Ni_{0.8}Fe_{0.2}(5)$ / Co(1) / Cu(2.5) / Co(3) / Fe-Co-O(30)

F(i): $ABO_3(30)$ / Co(3) / Cu(2.5) / Co(1) / $Ni_{0.8}Fe_{0.2}(5)$ / Co(1) / Cu(2.5) / Co(3) / $ABO_3(30)$

As in Example 1, the sample MR devices produced as described above were subjected to a heat treatment. Then, MR characteristics thereof were evaluated in substantially the same manner as in Example 2. The results are shown in Table 4 below.

TABLE 4

| Sample No. | $ABO_3$ layer | MR ratio | Hp(kA/m) |
| --- | --- | --- | --- |
| D(1) | $LaBO_3$ | 22 | 20 |
| D(2) | $PrBO_3$ | 21 | 20 |

TABLE 4-continued

| Sample No. | ABO₃ layer | MR ratio | Hp(kA/m) |
|---|---|---|---|
| D(3) | NdBO₃ | 21 | 20 |
| D(4) | SmBO₃ | 22 | 20 |
| D(5) | GdBO₃ | 21 | 20 |
| D(6) | TbBO₃ | 20 | 20 |
| D(7) | DyBO₃ | 20 | 20 |
| D(8) | Y BO₃ | 22 | 20 |
| D(9) | HoBO₃ | 20 | 20 |
| D(10) | BiBO₃ | 20 | 20 |
| D(11) | CaBO₃ | 21 | 20 |
| D(12) | SrBO₃ | 21 | 20 |
| E(1) | LaBO₃ | 28 | 40 |
| E(2) | PrBO₃ | 27 | 35 |
| E(3) | NdBO₃ | 27 | 40 |
| E(4) | SmBO₃ | 28 | 45 |
| E(5) | GdBO₃ | 27 | 30 |
| E(6) | TbBO₃ | 26 | 30 |
| E(7) | DyBO₃ | 26 | 30 |
| E(8) | Y BO₃ | 28 | 45 |
| E(9) | HoBO₃ | 26 | 35 |
| E(10) | BiBO₃ | 26 | 35 |
| E(11) | CaBO₃ | 27 | 35 |
| E(12) | SrBO₃ | 27 | 35 |
| F(1) | LaBO₃ | 29 | 45 |
| F(2) | PrBO₃ | 28 | 40 |
| F(3) | NdBO₃ | 28 | 45 |
| F(4) | SmBO₃ | 29 | 50 |
| F(5) | GdBO₃ | 28 | 35 |
| F(6) | TbBO₃ | 27 | 35 |
| F(7) | DyBO₃ | 27 | 35 |
| F(8) | Y BO₃ | 29 | 50 |
| F(9) | HoBO₃ | 27 | 40 |
| F(10) | BiBO₃ | 27 | 40 |
| F(11) | CaBO₃ | 28 | 40 |
| F(12) | SrBO₃ | 28 | 40 |

As can be appreciated from the results shown in Table 4, an extremely large MR ratio can be obtained with an MR device according to this example of the present invention, which had not been realized by the conventional MR devices. This appears to be due to the fact that the magnetization direction of the pinned layer 3 is well fixed by a large pinning effect of the pinning layer 2 shown in FIG. 3A, thereby achieving satisfactory magnetization antiparallelism between pinned layer 3 and the free layer 5.

The sample devices D(i) showed to have slightly smaller MR ratios and small Hp values. This is due to the use of IrMn for the upper pinning layer. However, the sample devices D(i) are advantageous in that it is relatively easy to form the upper lead section (13 in FIG. 4) of the MR device section when producing an MR head since the upper layer is a metal layer.

Example 6

A yoke type head, as illustrated in FIG. 8, was produced while using the sample MR device F(8). An Al-O super thin film about 2 nm thick produced by a plasma oxidation method was used for the insulation film section 82 in the structure illustrated in FIG. 8.

A Co-Nb-Zr-type amorphous alloy layer having a high transmissivity was used for the yoke section 81. A comparison was made between the output of the yoke-type MR head of this example and that of a comparative MR head B(O) of Example 3 shown in Table 2. The comparison showed that the output of the yoke-type MR head of this example was increased by about +3db from that of the comparative MR head.

The exchange coupling film employing a pinning layer made of an oxide of the present invention can provide a large pinning magnetic field. Moreover, the MR device employing the same can provide a large MR ratio and a large pinning magnetic field as compared with those provided by the conventional MR device, thereby realizing an MR head having a high output and stable characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An exchange coupling film, comprising a ferromagnetic layer and a pinning layer which is provided in contact with the ferromagnetic layer for pinning a magnetization direction of the ferromagnetic layer, the pinning layer comprising an $(AB)_2O_x$ layer, wherein:

O denotes an oxygen atom;

$2.8 < x < 3.2$; and a value t as defined by:

$$t = (Ra + Ro)/(\sqrt{2} \cdot (Rb + Ro))$$

(where Ra, Rb and Ro denote the ion radii of the atoms A, B and O, respectively)

satisfies $0.8 < t < 0.97$.

2. An exchange coupling film according to claim 1, wherein the $(AB)_2O_x$ comprises an antiferromagnetic layer.

3. An exchange coupling film according to claim 1, wherein the atom B of the $(AB)_2O_x$ layer comprises a transition metal atom.

4. An exchange coupling film according to claim 1, wherein the atom B of the $(AB)_2O_x$ layer comprises an Fe atom.

5. An exchange coupling film according to claim 1, wherein the atom A of the $(AB)_2O_x$ layer comprises a rare earth atom.

6. An exchange coupling film according to claim 1, wherein the atom A of the $(AB)_2O_x$ layer comprises an alkaline-earth atom.

7. An exchange coupling film according to claim 1, wherein the pinning layer comprises a layered structure of the $(AB)_2O_x$ layer and an NiO layer.

8. An exchange coupling film according to claim 7, wherein the $(AB)_2O_x$ layer is provided in contact with the ferromagnetic layer.

9. An exchange coupling film according to claim 1, wherein the pinning layer comprises a layered structure of the $(AB)_2O_x$ layer and an Fe-M-O layer (where M=Al, Ti, Co, Mn, Cr, Ni or V).

10. An exchange coupling film according to claim 9, wherein the Fe-M-O layer comprises an $(Fe_{1-x}M_x)_2O_3$ layer (where M=Al, Ti, Co, Mn, Cr, Ni or V, and $0.01 \leq x \leq 0.4$).

11. A magnetoresistance effect device, comprising a substrate and a multilayer film, wherein:

the multilayer film comprises at least two ferromagnetic layers, a non-magnetic layer and a pinning layer for pinning a magnetization direction of the ferromagnetic layer;

the ferromagnetic layers are deposited via the non-magnetic layer interposed therebetween;

at least one of the ferromagnetic layers is a pinned layer whose magnetization direction is fixed by the pinning layer which is provided in contact with the one of the ferromagnetic layers on an opposite side of another one of the ferromagnetic layers with respect to the non-magnetic layer;

at least one of the ferromagnetic layers is a free layer whose magnetization direction is allowed to rotate freely;

a change in an angle between the magnetization direction of the pinned layer and the magnetization direction of the free layer causes an electric resistance of the device to vary; and the pinning layer comprises an $(AB)_2O_x$ layer, wherein:
O denotes an oxygen atom;
$2.8 < x < 3.2$; and
a value t as defined by:
$t = (Ra+Ro)/(\sqrt{2} \cdot (Rb+Ro))$
(where Ra, Rb and Ro denote the ion radii of the atoms A, B and O, respectively)
satisfies $0.8 < t < 0.97$.

12. A magnetoresistance effect device according to claim 11, wherein the pinning layer comprises a layered structure of the $(AB)_2O_x$ layer and an NiO layer.

13. A magnetoresistance effect device according to claim 11, wherein the pinning layer comprises a layered structure of the $(AB)_2O_x$ layer and an Fe-M-O layer (where M=Al, Ti, Co, Mn, Cr, Ni or V).

14. A magnetoresistance effect device according to claim 11, wherein the atom B of the $(AB)_2O_x$ layer comprises a transition metal atom.

15. A magnetoresistance effect device according to claim 11, wherein the atom A of the $(AB)_2O_x$ layer comprises a rare earth atom.

16. A magnetoresistance effect device according to claim 11, wherein the atom A of the $(AB)_2O_x$ layer comprises an alkaline-earth atom.

17. A magnetoresistance effect device according to claim 11, wherein AB of the $(AB)_2O_x$ layer comprises $La_{1-y}Fe_y$ ($0.4 < y < 0.6$).

18. A magnetoresistance effect device according to claim 11, the atom A of the $(AB)_2O_x$ layer comprising an A' atom or an A" atom, and the atom B of the $(AB)_2O_x$ layer comprising an B' atom or an B" atom, wherein:
the A' atom comprises a rare earth atom;
the A" atom comprises an alkaline-earth atom;
the B' atom comprises an Fe atom; and
the B" atom comprises an Ni or Mn atom.

19. A magnetoresistance effect device according to claim 18, wherein:
the A' atom comprises an La atom;
the A" atom comprises an Sr atom;
the B' atom comprises an Fe atom; and
the B" atom comprises an Ni atom.

20. A magnetoresistance effect device according to claim 11, wherein the free layer comprises two or more magnetic films deposited via the non-magnetic layer interposed therebetween.

21. A magnetoresistance effect device according to claim 11, wherein the pinned layer comprises two magnetic layers having an antiferromagnetic exchange coupling therebetween via the nonmagnetic layer interposed therebetween.

22. A magnetoresistance effect device according to claim 11, wherein:
the multilayer comprises a first pinning layer, a first pinned layer, a first non-magnetic layer, a ferromagnetic free layer, a second non-magnetic layer, a second pinned layer and a second pinning layer which are deposited in this order on the substrate;
the first pinning layer fixes a magnetization direction of the first pinned layer;
the second pinning layer fixes a magnetization direction of the second pinned layer; and
the first pinning layer comprises the $(AB)_2O_x$ layer.

23. A magnetoresistance effect device according to claim 22, wherein the second pinning layer comprises a T-Mn (where T=Ir, Pt, Pd, Rh, or Ni).

24. A magnetoresistance effect device according to claim 22, wherein the second pinning layer comprises the $(AB)_2O_x$ layer.

25. A magnetoresistance effect device according to claim 22, wherein the first pinning layer or the first and second pinning layers comprise a layered structure of the $(AB)_2O_x$ layer and an NiO layer.

26. A magnetoresistance effect device according to claim 22, wherein the first pinning layer or the first and second pinning layers comprise a layered structure of the $(AB)_2O_x$ layer and an Fe-M-O layer (where M=Al, Ti, Co, Mn, Cr, Ni or V).

27. A magnetoresistance effect device according to claim 26, wherein the Fe-M-O layer comprises an $(Fe_{1-x}M_x)_2O_3$ layer (where M=Al, Ti, Co, Mn, Cr, Ni or V, and $0.01 \leq x \leq 0.4$).

28. A magnetoresistance effect device according to claim 22, wherein the atom B of the $(AB)_2O_x$ layer comprises an Fe atom.

29. A magnetoresistance effect device according to claim 22, wherein the atom A of the $(AB)_2O_x$ layer comprises a rare earth atom.

30. A magnetoresistance effect device according to claim 22, wherein the atom A of the $(AB)_2O_x$ layer comprises an alkaline-earth atom.

31. A magnetoresistance effect device according to claim 22, wherein AB of the $(AB)_2O_x$ layer comprises $La_{1-y}Fe_y$ ($0.4 < y < 0.6$).

32. A magnetoresistance effect device according to claim 22, the atom A of the $(AB)_2O_x$ layer comprising an A' atom or an A" atom, and the atom B of the $(AB)_2O_x$ layer comprising an B' atom or an B" atom, wherein:
the A' atom comprises a rare earth atom;
the A" atom comprises an alkaline-earth atom;
the B' atom comprises an Fe atom; and
the B" atom comprises an Ni or Mn atom.

33. A magnetoresistance effect device according to claim 32, wherein:
the A' atom comprises an La atom;
the A" atom comprises an Sr atom;
the B' atom comprises an Fe atom; and
the B" atom comprises an Ni atom.

34. A magnetoresistance effect device according to claim 22, wherein the free layer comprises two or more magnetic films deposited via the non-magnetic layer interposed therebetween.

35. A magnetoresistance effect device according to claim 22, wherein the pinned layer comprises two magnetic layers having an antiferromagnetic exchange coupling therebetween via the non-magnetic layer interposed therebetween.

36. A magnetoresistance effect head, comprising:
a magnetoresistance effect device according to claim 11; and
a shield gap section for insulating the magnetoresistance effect device and the shield section from each other.

37. A magnetoresistance effect head, comprising:
a magnetoresistance effect device according to claim 22; and
a shield gap section for insulating the magnetoresistance effect device and the shield section from each other.

38. A magnetoresistance effect head, comprising:
a magnetoresistance effect device according to claim 11; and a yoke section for introducing into the magnetoresistance effect device a magnetic field to be detected.

39. A magnetoresistance effect head, comprising:

a magnetoresistance effect device according to claim 22; and a yoke section for introducing into the magnetoresistance effect device a magnetic field to be detected.

40. A method for producing an exchange coupling film, the method comprising the steps of:

heating a substrate to a temperature of about 300° C. or higher; and depositing the exchange coupling film by a sputtering method using an Ar gas at a pressure of about 2 mTorr or less;

wherein the exchange coupling film comprises a pinning layer, the pinning layer comprising an $(AB)_2O_x$ layer, wherein:

O denotes an oxygen atom;

$2.8 < x < 3.2$; and a value t as defined by:

$t = (Ra + Ro)/(\sqrt{2} \cdot (Rb + Ro))$ (where Ra, Rb and Ro denote the ion radii of the atoms A, B and O, respectively)

satisfies $0.8 < t < 0.97$.

\* \* \* \* \*